United States Patent
Tang et al.

(10) Patent No.: US 7,659,560 B2
(45) Date of Patent: Feb. 9, 2010

(54) TRANSISTOR STRUCTURES

(75) Inventors: Sanh D. Tang, Boise, ID (US); Gordon A. Haller, Boise, ID (US); Prashant Raghu, Boise, ID (US); Ravi Iyer, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 11/716,433

(22) Filed: Mar. 8, 2007

(65) Prior Publication Data
US 2007/0166920 A1 Jul. 19, 2007

Related U.S. Application Data

(62) Division of application No. 11/219,077, filed on Sep. 1, 2005.

(51) Int. Cl.
H01L 21/8238 (2006.01)
(52) U.S. Cl. ............... 257/192; 438/259; 257/E21.639
(58) Field of Classification Search ................. 257/192
See application file for complete search history.

(56) References Cited

U.S. PATENT DOCUMENTS

| | | | |
|---|---|---|---|
| 4,878,994 A | 11/1989 | Jucha et al. | |
| 5,013,680 A | 5/1991 | Lowrey et al. | |
| 5,122,848 A | 6/1992 | Lee et al. | |
| 5,885,864 A * | 3/1999 | Ma | 438/253 |
| 5,909,618 A | 6/1999 | Forbes et al. | |
| 5,960,270 A | 9/1999 | Misra et al. | |
| 5,963,469 A | 10/1999 | Forbes | |
| 5,977,579 A | 11/1999 | Noble | |
| 6,072,209 A | 6/2000 | Noble et al. | |
| 6,150,687 A | 11/2000 | Noble et al. | |
| 6,157,060 A * | 12/2000 | Kerber | 257/316 |
| 6,191,470 B1 | 2/2001 | Forbes et al. | |
| 6,225,168 B1 | 5/2001 | Gardner et al. | |
| 6,310,367 B1 | 10/2001 | Yagishita et al. | |
| 6,498,062 B2 | 12/2002 | Durcan et al. | |
| 6,625,373 B1 | 2/2003 | Kim | |
| 6,696,746 B1 | 2/2004 | Farrar et al. | |
| 6,770,556 B2 * | 8/2004 | Yau et al. | 438/623 |

(Continued)

OTHER PUBLICATIONS

Changhyun Cho, et al., "A 6F2 DRAM Technology in 60nm era for Gigabit Densities", Symposium on VLSI Technology Digest of Technical Papers, 2005, pp. 36-37.

(Continued)

*Primary Examiner*—Steven Loke
*Assistant Examiner*—David Goodwin
(74) *Attorney, Agent, or Firm*—Wells St. John P.S.

(57) ABSTRACT

A transistor gate forming method includes forming a metal layer within a line opening and forming a fill layer within the opening over the metal layer. The fill layer is substantially selectively etchable with respect to the metal layer. A transistor structure includes a line opening, a dielectric layer within the opening, a metal layer over the dielectric layer within the opening, and a fill layer over the metal layer within the opening. The metal layer/fill layer combination exhibits less intrinsic less than would otherwise exist if the fill layer were replaced by an increased thickness of the metal layer. The inventions apply at least to 3-D transistor structures.

22 Claims, 11 Drawing Sheets

U.S. PATENT DOCUMENTS

| | | | |
|---|---|---|---|
| 6,844,591 B1 | 1/2005 | Tran | |
| 6,893,910 B1 | 5/2005 | Woo et al. | |
| 7,012,024 B2 | 3/2006 | Abbott | |
| 7,071,043 B2 | 7/2006 | Tang et al. | |
| 7,081,409 B2 | 7/2006 | Kang et al. | |
| 7,122,425 B2 | 10/2006 | Chance et al. | |
| 7,148,100 B2* | 12/2006 | Kim et al. | 438/218 |
| 7,160,789 B2 | 1/2007 | Park et al. | |
| 7,214,621 B2 | 5/2007 | Nejad et al. | |
| 7,244,659 B2 | 7/2007 | Tang et al. | |
| 7,253,053 B2 | 8/2007 | Eppich et al. | |
| 7,262,089 B2 | 8/2007 | Abbott et al. | |
| 7,282,401 B2 | 10/2007 | Juengling | |
| 7,285,812 B2 | 10/2007 | Tang et al. | |
| 7,349,232 B2 | 3/2008 | Wang et al. | |
| 7,384,849 B2 | 6/2008 | Parekh et al. | |
| 2002/0048920 A1* | 4/2002 | Pan | 438/595 |
| 2004/0041188 A1 | 3/2004 | Bissey et al. | |
| 2004/0183129 A1 | 9/2004 | Williams et al. | |
| 2005/0051854 A1 | 3/2005 | Cabral, Jr. et al. | |
| 2005/0056887 A1 | 3/2005 | Tran | |
| 2005/0095794 A1 | 5/2005 | Park | |
| 2006/0081948 A1 | 4/2006 | Lim et al. | |
| 2006/0118846 A1* | 6/2006 | Bissey et al. | 257/296 |
| 2006/0141708 A1 | 6/2006 | Kim et al. | |
| 2006/0289919 A1 | 12/2006 | Juengling | |
| 2007/0007571 A1* | 1/2007 | Lindsay et al. | 257/306 |
| 2007/0018223 A1* | 1/2007 | Abbott | 257/303 |

OTHER PUBLICATIONS

Wolf, et al., "Silicon Processing for the VLSI Era", Lattice Press, vol. 1, Second Edition, pp. 110-111.

J.Y. Kim et al., "The Breakthrough in data retention time of DRAM using Recess-Channel-Array Transistor (RCAT) for 88nm feature size and beyond", Symposium on VLSI Technology Digest of Technical Papers, 2003, pp. 11-12.

* cited by examiner

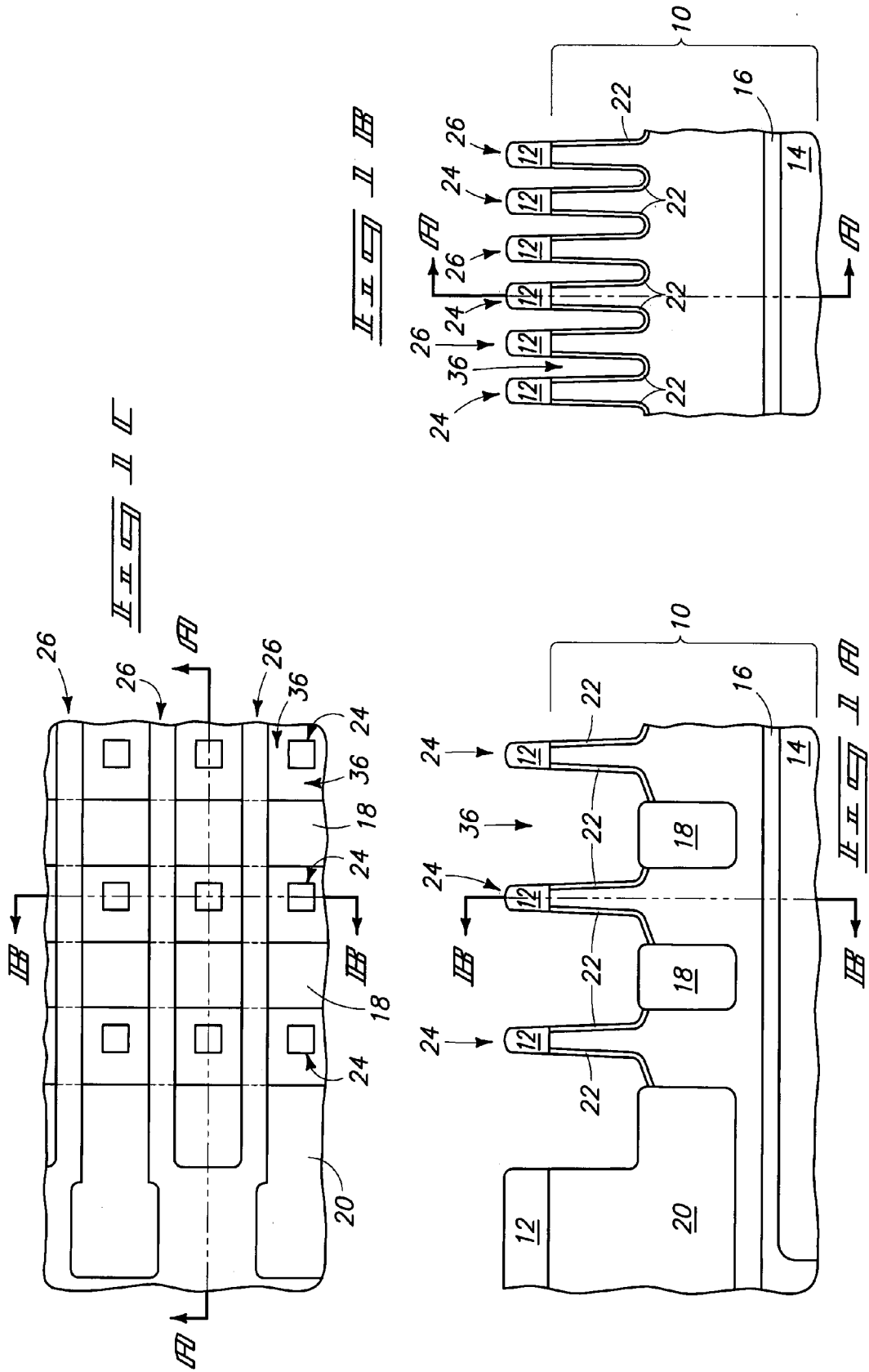

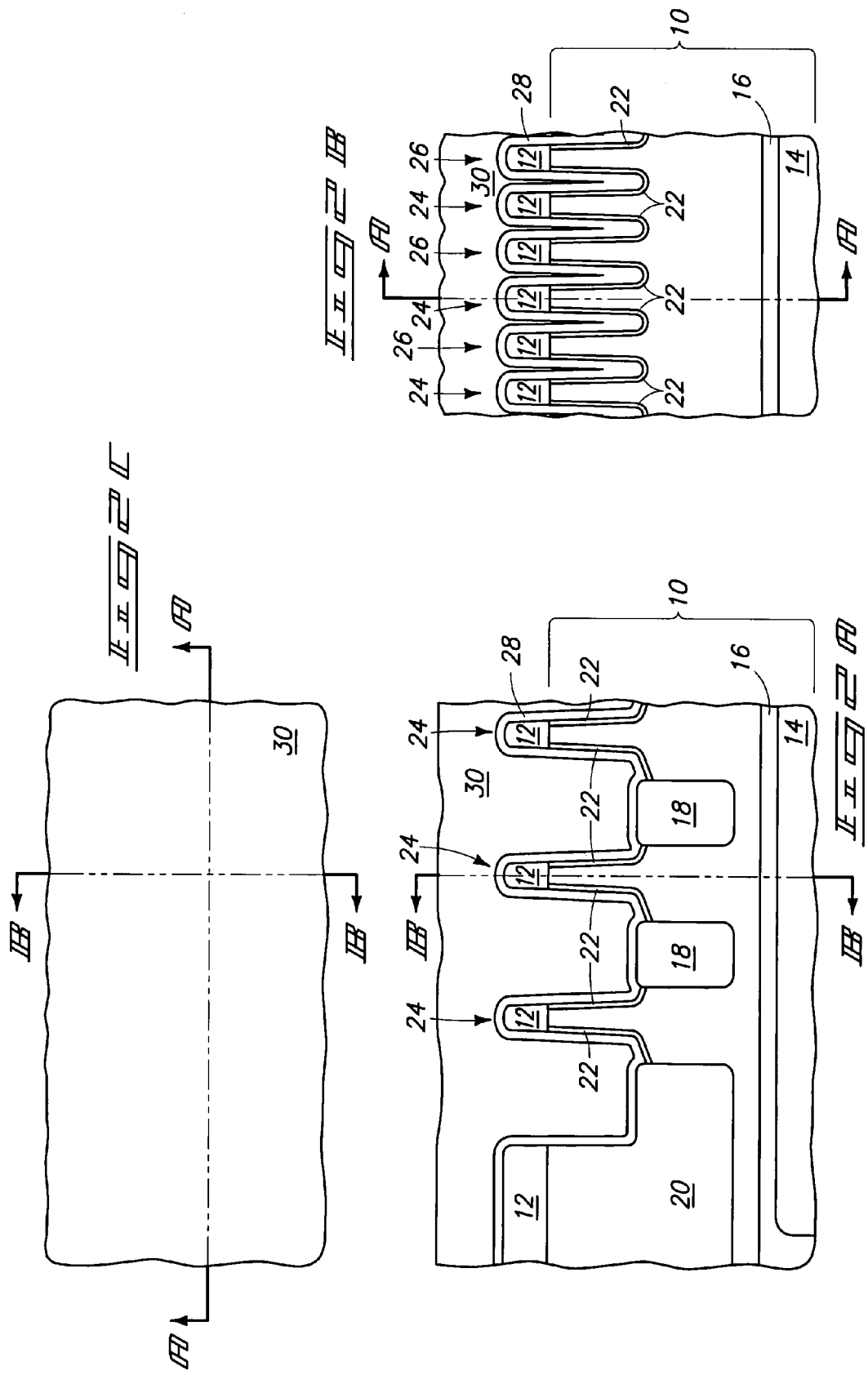

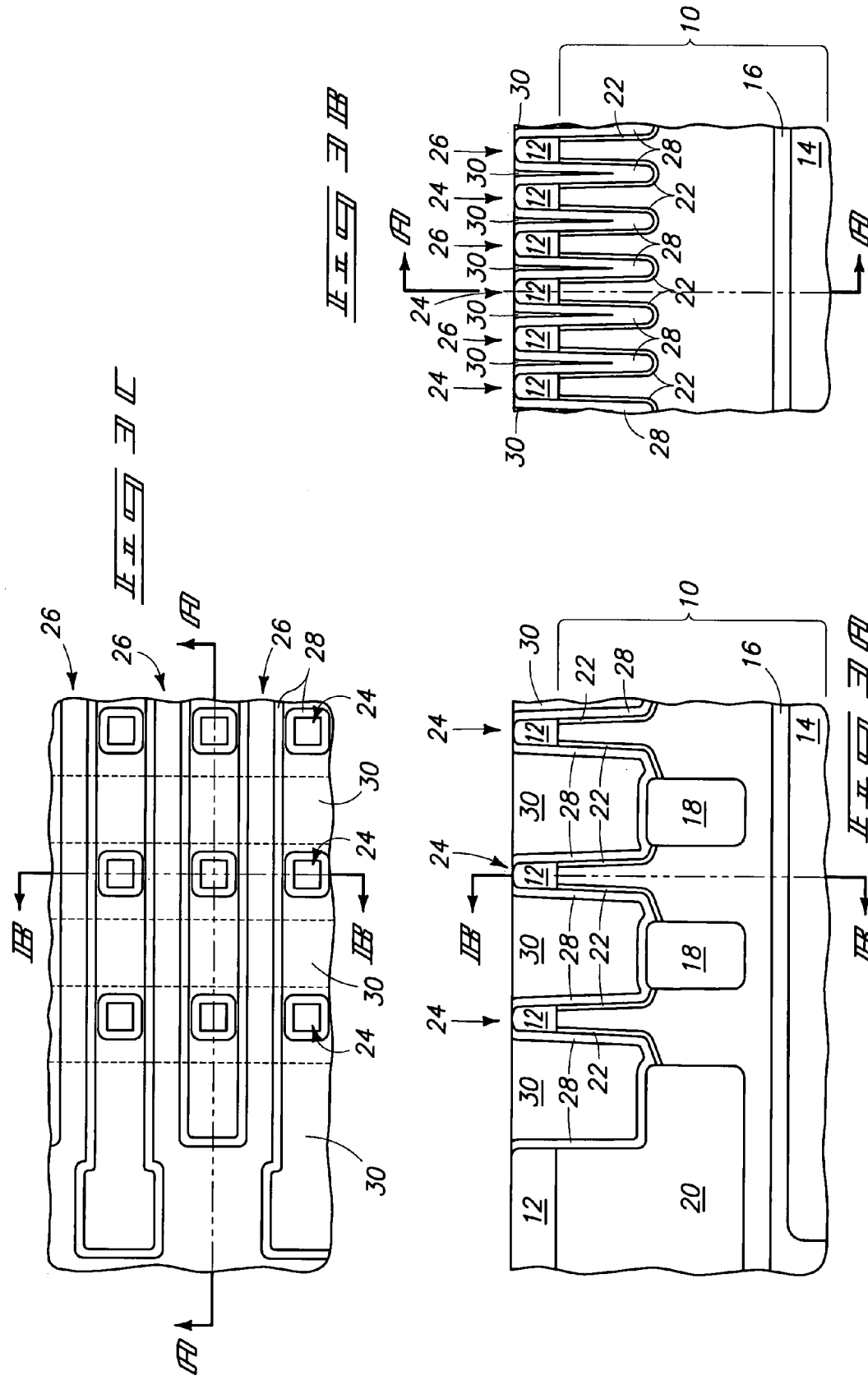

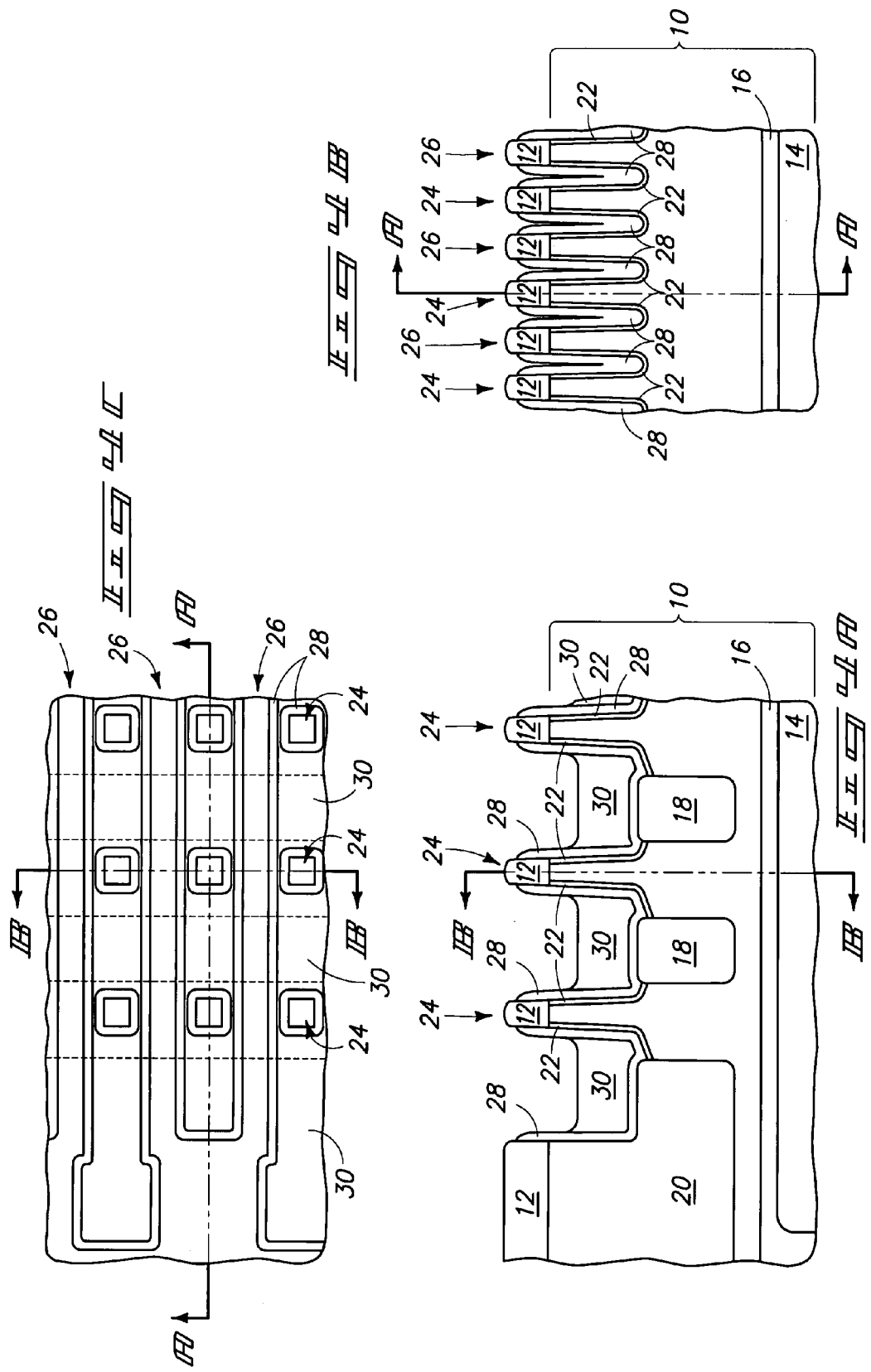

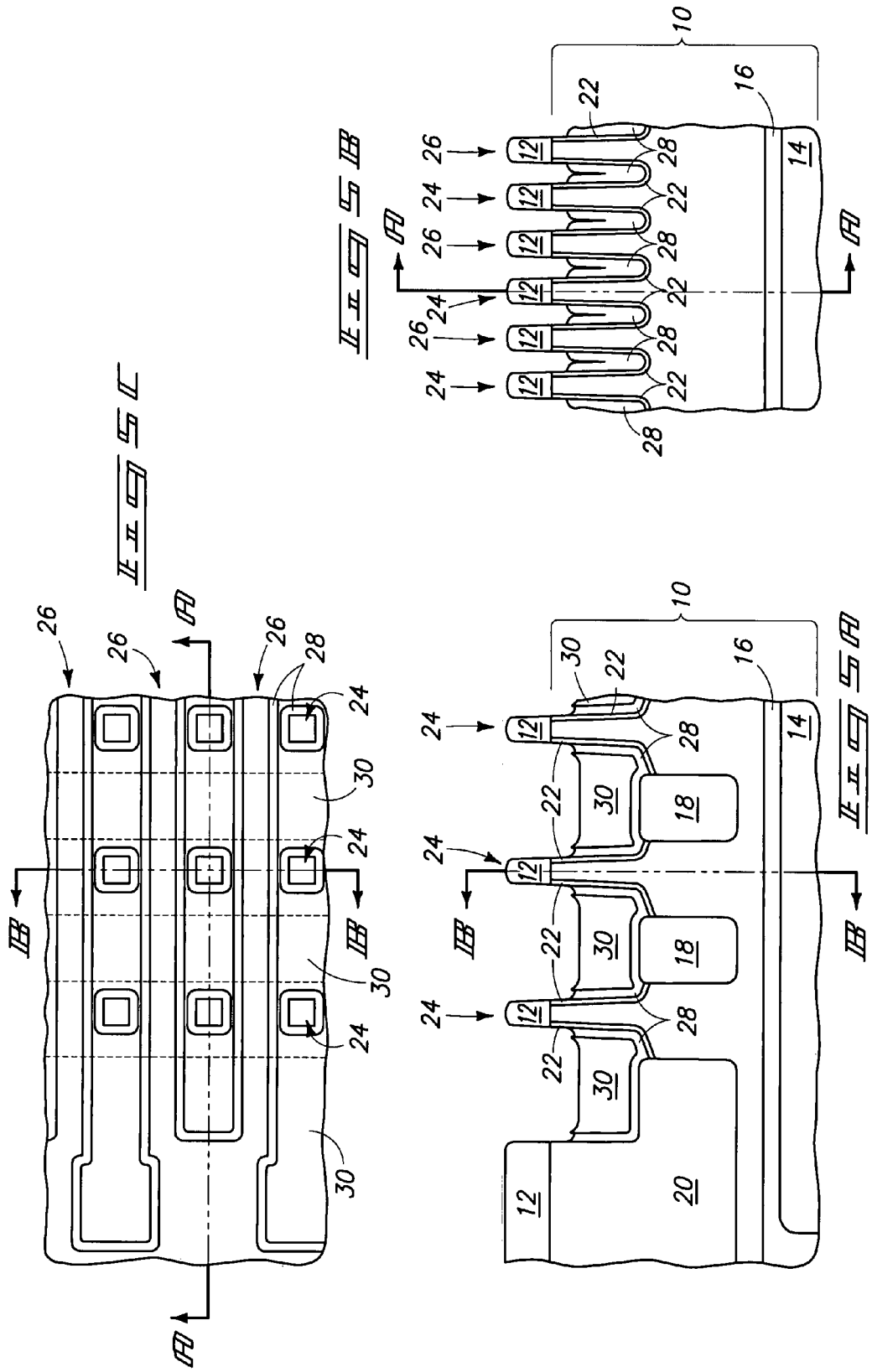

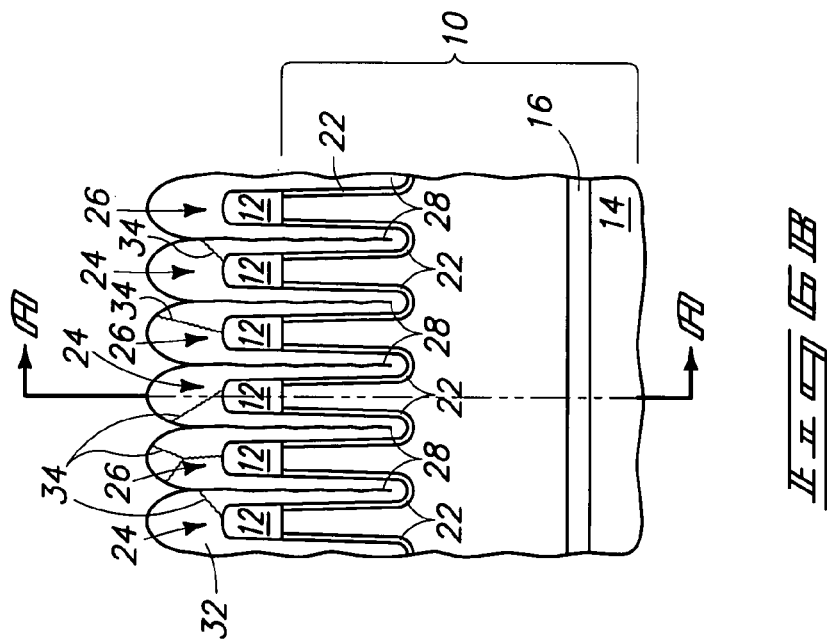
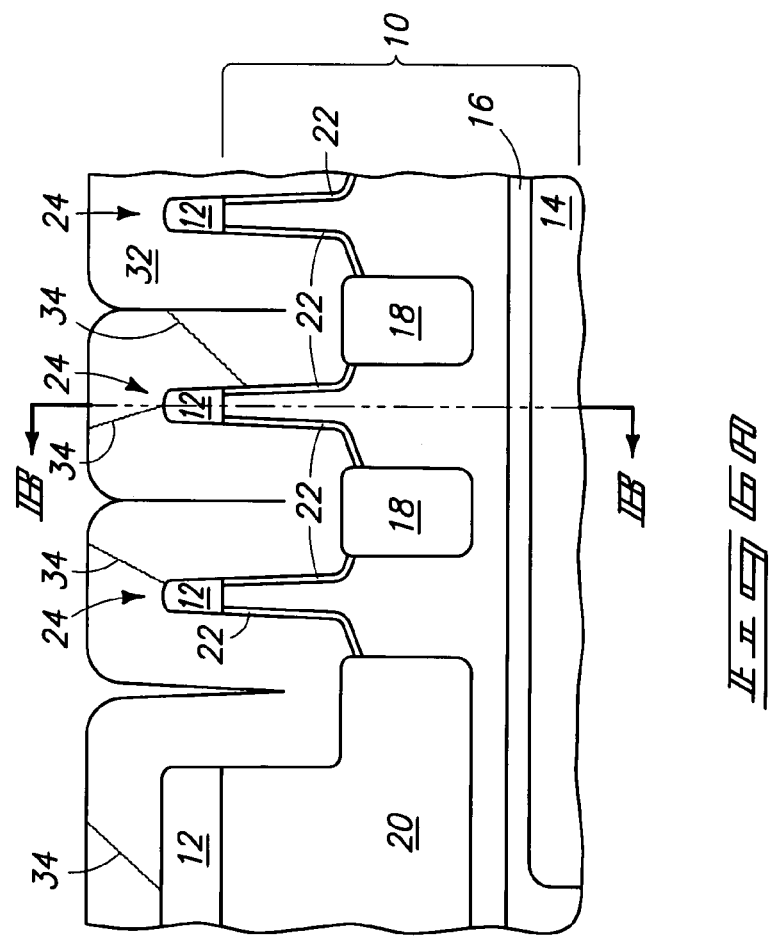

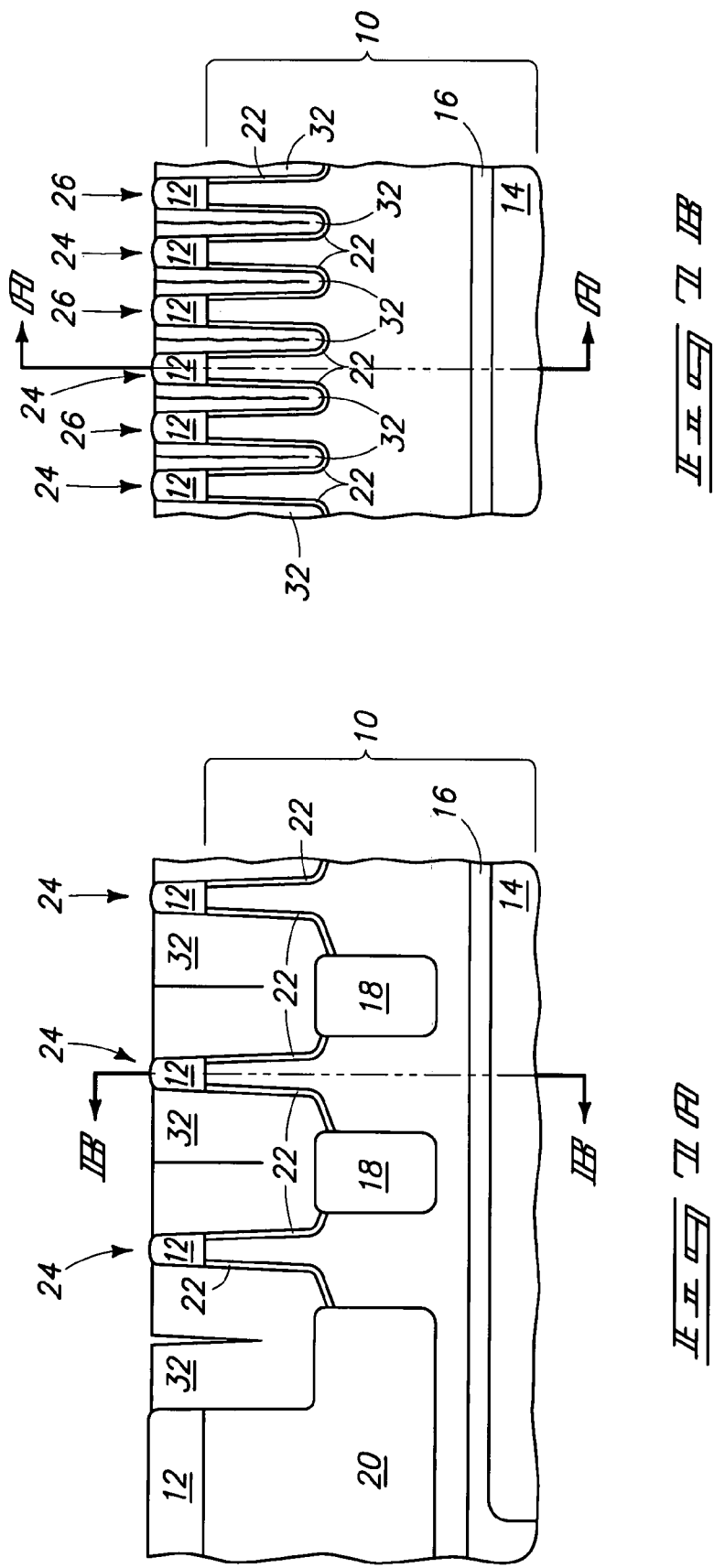

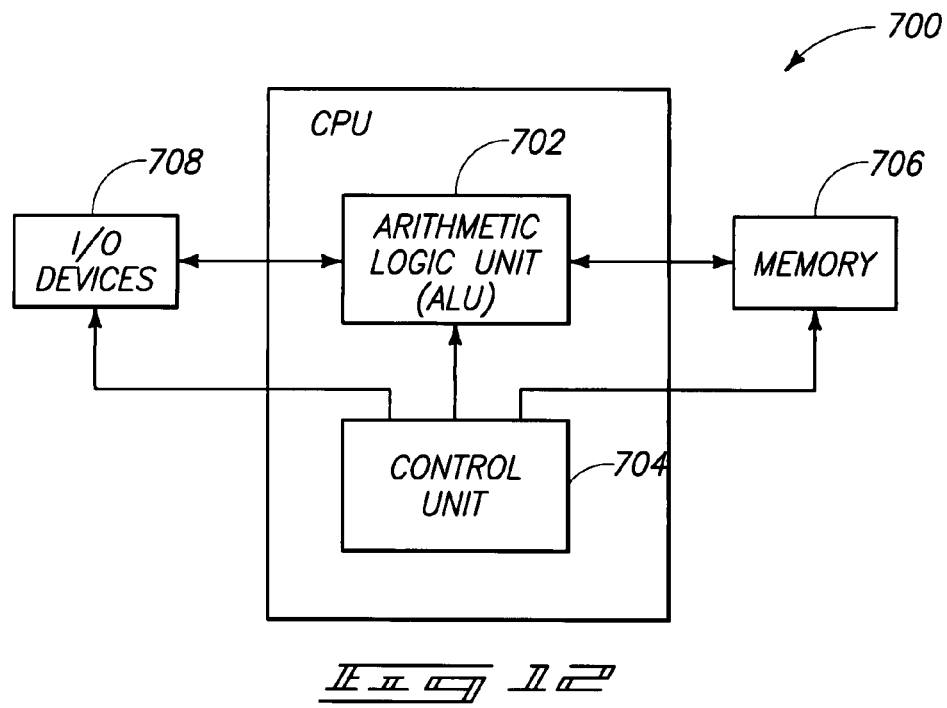
_Fig. 12_
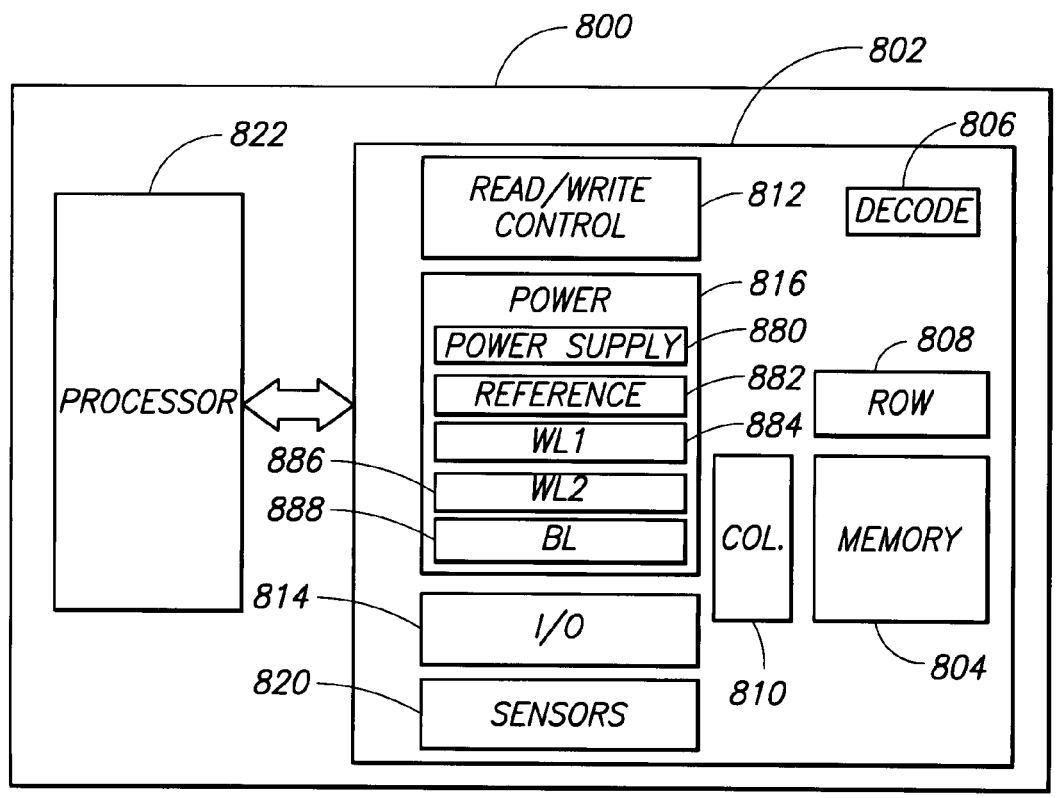
_Fig. 13_

US 7,659,560 B2

TRANSISTOR STRUCTURES

This patent resulted from a divisional application of U.S. patent application Ser. No. 11/219,077, filed Sep. 1, 2005, which is incorporated herein by reference.

TECHNICAL FIELD

The invention pertains to transistor gate forming methods and transistor structures.

BACKGROUND OF THE INVENTION

A continuing interest exists in aggressively reducing feature sizes of integrated circuitry. In conventional semiconductor-based integrated circuitry, polysilicon is often used as a gate electrode material in a field effect transistor (FET). However, polysilicon exhibits a resistivity generally considered too high for aggressive device scaling. Metal gate electrode materials have been identified to replace polysilicon. While metal gate electrode materials appear to function effectively in simple configurations, difficulties can arise in substituting metal gate electrode materials for polysilicon in three-dimensional (3-D) transistor devices and other devices with a more complex configuration. Accordingly, a desire exists to develop transistor gate forming methods and transistor structures capable of implementing metal gate electrode materials.

SUMMARY OF THE INVENTION

In one aspect of the invention, a transistor gate forming method includes forming a gate metal layer within a gate line opening extending into a semiconductive substrate and forming a gate fill layer within the opening over the metal layer. The fill layer is substantially selectively etchable with respect to the metal layer. By way of example, the metal layer may be substantially selectively etchable with respect to the fill layer. Aspects of the invention apply at least to recessed access devices, word lines in trenches, and other three-dimensional transistor structures.

In another aspect of the invention, a transistor gate forming method includes forming a gate line opening extending into a semiconductive substrate, the opening having a semiconductive bottom and semiconductive side walls. A gate dielectric is formed within the opening over the semiconductive side walls and semiconductive bottom, the dielectric layer having an insulative bottom and insulative side walls. A gate metal layer is formed within the opening over the insulative bottom and insulative side walls, the metal layer having a conductive bottom and conductive side walls. A gate fill layer is formed within the opening over the conductive bottom and conductive side walls. The method includes removing excess fill layer substantially selectively with respect to the metal layer while exposing a portion of the metal layer under the fill layer without exposing the gate dielectric under the metal layer.

In a further aspect of the invention, a transistor structure includes a gate line opening extending into a semiconductive substrate, the opening having a semiconductive bottom and semiconductive side walls. A gate dielectric layer is within the opening over the semiconductive side walls and semiconductive bottom, the dielectric layer having an insulative bottom and insulative side walls. A gate metal layer is within the opening over the insulative bottom and insulative side walls, the metal layer having a conductive bottom and conductive side walls. A gate fill layer is within the opening over the conductive bottom and conductive side walls. The metal layer/fill layer combination exhibits less intrinsic less than would otherwise exist if the fill layer were replaced by an increased thickness of the metal layer.

BRIEF DESCRIPTION OF THE DRAWINGS

Preferred embodiments of the invention are described below with reference to the following accompanying drawings. Reference numerals are not used to identify some of the duplicated features having identical, repetitive structure where identification of the duplicates is clearly discernable.

FIGS. 1A-B to 5A-B are partial sectional views and FIGS. 1C to 5C are top views at sequential process stages leading to formation of the transistor structure in FIGS. 5A-C formed on a substrate according to one aspect of the invention.

FIGS. 6A-B to 8A-B are partial sectional views at sequential process stages leading to formation of the transistor structure in FIGS. 8A-B formed on a substrate.

FIG. 12 is a high level lock diagram of an electronic system according to an exemplary aspect of the present invention.

FIG. 13 is a simplified block diagram of an exemplary memory device according to an aspect of the present invention.

DETAILED DESCRIPTION OF THE PREFERRED EMBODIMENTS

Figure 8B:
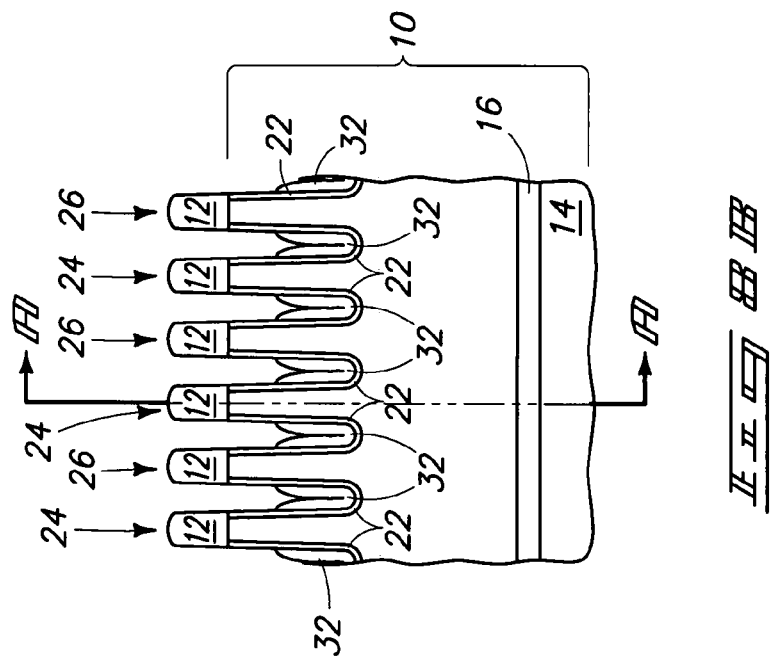

FIGS. 1A-B show partial sectional views and FIG. 1C shows a top view of an in-process substrate prepared for formation of a conventional recessed access device (RAD), one of a variety of devices implementing 3-D transistor configurations. "Recessed access" refers to a device with a word line (i.e., transistor gate) recessed into the semiconductive substrate (e.g., monocrystalline silicon wafer). Transistor gates that surround or partially surround transistor channels, as well as channels that surround or partially surround gates, are typical of 3-D devices as compared to planar devices where the gate-to-dielectric-to-channel interfaces are planar. As will be appreciated, substrate 10 in FIGS. 1A-C possesses a structure processed to provide a gate that laterally surrounds part of a transistor channel. In addition, the structure also provides a transistor channel that laterally surrounds part of the gate.

The goal of RADs is to address some of the concerns from which conventional MOSFETs may suffer. For example: 1) quantum-mechanical tunneling (QMT) of carriers through thin gate oxide, 2) QMT of carriers from source to drain and from drain to body of a MOSFET, 3) control of density and location of dopants in channel, source, and drain, and 4) unacceptable $I_{off}$ currents.

Substrate 10 may be a semiconductive substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A mask layer 12 shown in FIGS. 1A-C remains from the conventional process used to form gate line openings 36 extending into substrate 10 that will receive gate electrode material. Mask layer 12 may include silicon nitride. Substrate 10 also includes a conventional n-type conductivity doped tub 14 and a p-type conductivity doped well 16. Shallow trench isolation 18 and shallow trench isolation oxide 20 are formed within substrate 10 to separate individual transistors and other devices in an array of transistors that may be formed from the subsequent transistor structure. A gate dielectric layer 22 formed on the semiconductive bottom and semiconductive sidewalls of line openings 36 may be a conventional gate oxide or other suitable material. Notably, portions of the bottom of line openings 36 are isolation 18 or 20, but other portions are semiconductive, as shown in FIG. 1B, to form a transistor channel discussed below.

Source/drain pillars 24 are formed between opposing source/drain walls 26. An elevationally upper portion of individual pillars 24 and individual walls 26 can ultimately become source/drain regions. An elevationally lower portion of respective pillars 24 and respective walls 26 can ultimately become part of a channel region along with a portion of substrate 10 below line openings 36. Thus, a channel region can extend vertically from a source down through a pillar (or wall), through substrate 10 below a line opening, and vertically up through a corresponding wall (or pillar) to a drain. Pillars 24 may be drains connecting to a memory cell's capacitor and walls 26 may be a common source connecting to column address lines. For the exemplary RAD of FIGS. 1A-C, lateral spacing between pillars 24 and walls 26 may be from about 300 to about 400 Angstroms. Spacing between pillars 24 in a given row sharing a common line opening 36 may be from about 500 to about 1500 Angstroms.

In one approach shown in FIGS. 6A-B, a gate electrode layer 32 is formed within line openings 36 to a thickness generally sufficient to fill the gate line openings 36. A thickness that is at least about one-half of the spacing between pillars 24 normally would be sufficient or, for the FIGS. 6A-B example, from about 250 to about 750 Angstroms. However, FIGS. 6A-B also show cracks 34 from intrinsic stress that may result when electrode layer 32 is deposited especially thick. Cracks generally result from high tensile stress, while lifting or other defects result from high compressive stress. When forming titanium nitride as electrode layer 32, cracks may occur apparently as the result of such high tensile stress. Cracking and/or lifting may occur for similar reasons in a variety of other conventional metal layers used for gate electrodes. In the context of the present document, "metal" layer refers to a conductive layer containing a metal compound or compounds (which compound may further include semimetals and/or non-metals), an elemental metal, or a metal alloy. Elements considered to be metals in this document do not include semimetals. Accordingly, semimetals B, Si, As, Se, Te, and At are not considered to be metals.

Exemplary materials for metal gates include titanium nitride, cobalt silicide, nickel silicide, tantalum, tantalum nitride, tungsten nitride, and other thermally stable metal layers. A space is apparent in FIG. 6A between portions of electrode layer 32 that failed to "pinch off" during depositions, for example, because of high tensile stress in electrode layer 32. Cracking in titanium nitride tends to appear whenever thickness exceeds about 500 Angstroms. Also, seams inside line openings 36 may fail to merge consistently, producing the visible merge boundaries shown in FIG. 6A.

Figure 8A:
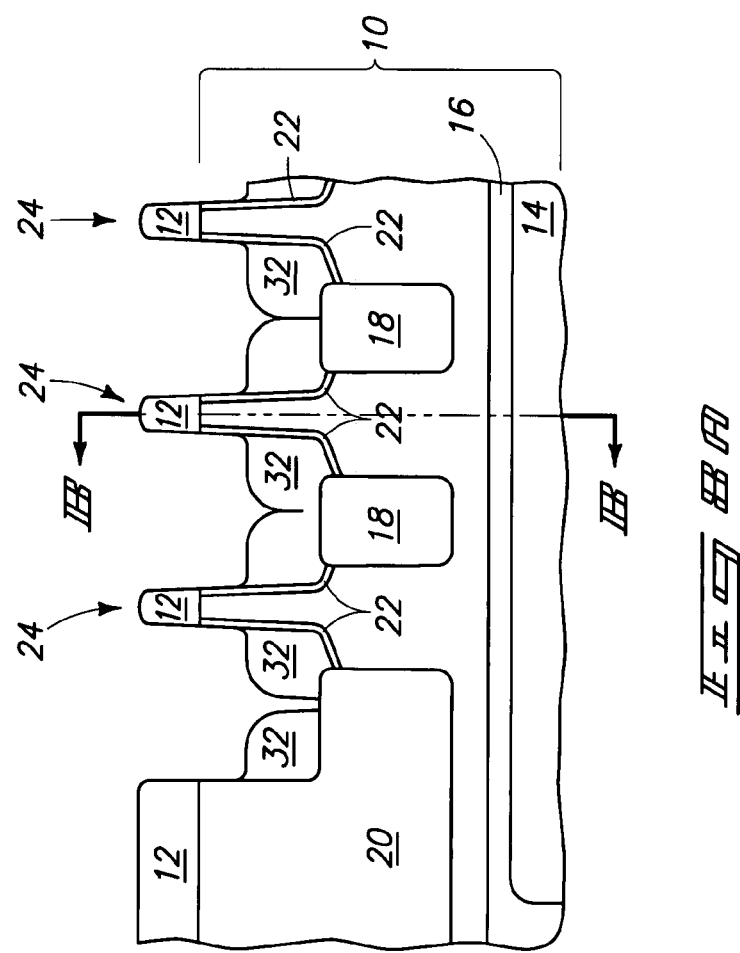

FIGS. 7A-B show the structure in FIGS. 6A-B after chemical-mechanical polishing, removing excess portions of electrode layer 32 elevationally above mask layer 12. The polishing step may be configured to stop on material forming mask layer 12, such as silicon nitride or silicon oxide. Electrode layer 32 in FIGS. 7A-B is then etched to recess such material into line openings 36 as shown in FIGS. 8A-B. Reactive ion etching (RIE) in a LAM 9400 available from Lam Research Corp. in Fremont, Calif. using 30-55 standard centimeter$^3$/minute (sccm) $Cl_2$ and 10-20 sccm $CF_4$ represents one example. As is apparent from FIG. 8A, such etching may extend merge boundaries as cracks and widen insufficiently pinched-off seams further into electrode layer 32. Although not viewable in FIGS. 8A-B, stringers may form along walls 26, around pillars 24, and/or other parts of line openings 36 where electrode layer 32 is intended to be removed. Such stringers may result from the non-uniformities discussed above and are difficult to remove. Also, although not viewable in FIGS. 8A-B, etching processes such as RIE and others may damage exposed portions of gate dielectric 22 as electrode layer 32 recedes from covering gate dielectric 22 and shrinks into line openings 36. Accordingly, it may be appreciated that the somewhat small non-uniformities of electrode layer 32 shown in FIGS. 6A-B may produce significant defects after continued processing.

Those of ordinary skill often conduct series resistance ($R_s$) tests as a measure of proper device formation. A high variation in series resistance potentially indicates defects in some device structures. A low series resistance is desired for a gate electrode since it functions as a conductor. However, the defects shown in FIGS. 8A-B may produce unacceptably high $R_s$, which seems to be a particular problem in processes forming gate electrodes in 3-D transistors.

According to one aspect of the invention, problems with formation of electrode layer 32 described herein may be reduced in a transistor gate forming method that includes forming a gate metal layer within a gate line opening extending into a semiconductive substrate and forming a gate fill layer within the opening over the metal layer. The fill layer is substantially selectively etchable with respect to the metal layer. By way of example, the metal layer may be substantially selectively etchable with respect to the fill layer. Once those of ordinary skill appreciate the processes and advantages described herein, it will be understood that aspects of the invention apply to a RAD, as well as to other transistor structures. For example, the gate line opening may be a word line trench with the gate metal layer being formed within the trench but not providing recessed access.

FIGS. 2A-C show the structure of FIGS. 1A-C after formation of a metal layer 28 within line openings 36 and formation of a fill layer 30 within line openings 36 over metal layer 28. The metal layer may include titanium nitride, among other materials mentioned herein and potentially others known to those of ordinary skill, and may be formed by any conventional method. Various types of chemical vapor deposition (CVD), such as atomic layer deposition (ALD), are particularly applicable. Physical vapor deposition (PVD) or supercritical fluid deposition (SFD) may be used instead. The fill layer may be semiconductive or conductive if needed to provide conductivity for operation of completed transistors or for some other reason identified by those of ordinary skill. However, the fill layer may be insulative, assuming that the metal layer functions adequately as a gate electrode.

Titanium nitride having a thickness of from about 100 to about 200 Angstroms, preferably 150 Angstroms, has been identified as a metal layer thickness resulting in a suitable gate electrode. Bulk thickness of a gate electrode formed with metal layer 28 is determined by its elevational height. Since metal layer 28 shown in FIGS. 5A-B may extend from about 600 to about 1,200 Angstroms, or preferably 1,000 Angstroms, up the side walls of gate dielectric 22, the elevational height may provide adequate bulk thickness even with a thin layer. Even though metal layer 28 and fill layer 30 are shown as single layers in the Figures, it will be appreciated that multiple layers might be suitable. Even so, single layers are preferred for processing simplicity.

The fill layer may have a thickness of from about 1,500 to about 3,500 Angstroms and may include polysilicon, tungsten, tungsten silicide, and other materials deposited by any conventional method, for example, CVD. If polysilicon, then it may be conductively doped. Silicon oxide deposited from tetraethylorthosilicate (TEOS) as well as borophosphosilicate glass (BPSG) constitutes suitable insulative materials that may be used for the fill layer. Desirable properties for the fill layer include exhibiting a porosity greater than a porosity of the metal layer. A more porous or "spongy" material as the fill layer tends to be deposited at significant thicknesses, such as greater than 500 Angstroms, without exhibiting intrinsic stress sufficient to crack, lift, or produce other defects. Accordingly, another desirable property of the fill layer is that a combination of the metal layer and the fill layer exhibits less intrinsic stress than would otherwise exist if the fill layer were replaced by an increased thickness of the metal layer. Porous materials constitute one type of material that may provide the lower intrinsic stress, but other materials that might not exhibit a porosity greater than the porosity of the metal layer might also exhibit less stress.

As indicated, a thickness of the fill layer within the line opening may be greater than a thickness of the metal layer within the line opening. FIGS. 2A-C show forming fill layer 30 to fill all of line opening 36 over metal layer 28. Forming the fill layer may include covering the metal layer, at least within the opening, with the fill layer. Such a process does not necessarily including filling all of the opening over the metal layer.

FIGS. 3A-C show the structure of FIGS. 2A-C after chemical-mechanical polishing to remove excess fill layer 30. The polishing stops on mask layer 12, which may contain silicon nitride, but may instead stop on metal layer 28, which may contain titanium nitride. Subsequently, FIGS. 4A-C show removing a further excess of fill layer 30 substantially selectively with respect to metal layer 28. As is apparently from FIGS. 4A-C, some of metal layer 28 is removed while removing further excess fill layer 30, however, the amount removed is small compared to the significant thickness of fill layer 30 that is removed. Within the context of the present document, substantially selective removal refers to a selectivity ratio of at least about 2 to 1, but preferably at least about 5 to 1. Examples of a suitable substantially selective removal processes include RIE and a selective wet etch. Known process chemistries exist that are capable of etching polysilicon, TEOS-deposited silicon oxide, or BPSG selectively with respect to titanium nitride. Polysilicon may be selectively etched using HBr or $CF_4$. TEOS-deposited silicon oxide and BPSG may be selectively etched using $CF_4$ or $CH_2F_2$.

FIGS. 5A-C show the structure of FIGS. 4A-C after further etching of metal layer 28 selectively with respect to fill layer 30. Substantially selective removal of metal layer 28 maintains the dimensions of fill layer 30 shown in FIGS. 4A-C. However, it is conceivable that removal of metal layer 28 may occur non-selectively such that some additional portion of fill layer 30 is removed during such process. A suitable substantially selective conventional etch using $NH_4OH$, $H_2O_2$, and deionized water removes titanium nitride substantially selectively with respect to polysilicon and $SiO_2$. As a result of the uniform deposition, low intrinsic stress, reduced cracking or lifting, and consistent merging achievable with materials that may be suitable for the large thickness of fill layer 30, but which may not be suitable for metal layer 28 with a large thickness, significant advantage can result from using fill layer 30. Namely, stress of the combined metal layer/fill layer may be reduced, yielding more uniform gate electrode structures. Also, average $R_s$ as well as variation in $R_s$ may be reduced. Further, the occurrence of stringers may be reduced. Another advantage of methods described herein includes protecting the gate dielectric with the metal layer during processes that may damage the gate dielectric, such as removing excess fill layer. Importantly, forming the FIGS. 5A-C structures may be implemented using conventional process tools.

An advantage of using conductive material for fill layer 30 includes facilitating contact of metal layer 28 with other conductive circuit components and it is preferred over insulative material for fill layer 30. As is apparent from FIG. 5C, fill layer 30 may provide a landing pad area for contacts. As is apparent from FIG. 5A, the dimensions of a resulting gate electrode containing metal layer 28 determines the portions of pillars 24 and walls 26 that may be used as channel regions. Channel regions may exist where dielectric layer 22 is positioned between metal layer 28 and a semiconductive bottom and/or semiconductive side wall of line opening 36 into substrate 10. Remaining upper portions of pillars 24 and walls 26 not within such channel may constitute source/drain regions. Conventional processing, including but not limited to doping and/or ion implantation, may be used to form the channels and source/drain regions.

Figure 9:
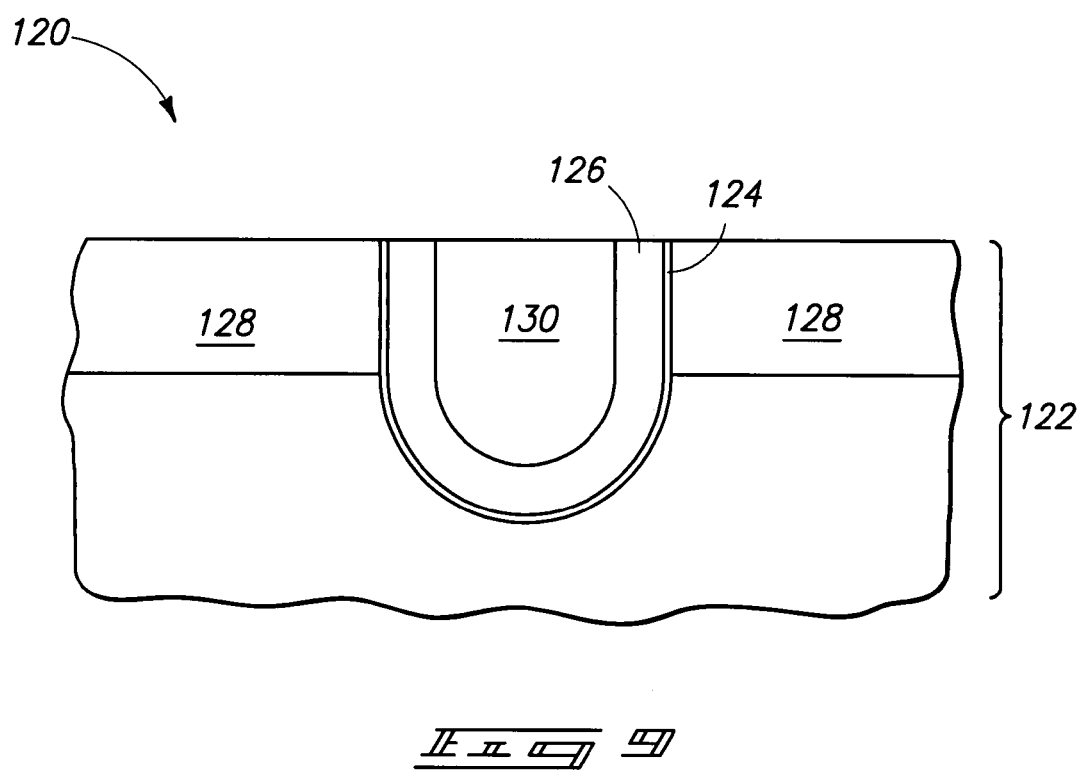
FIG. 9 is a partial sectional view of an alternative transistor structure formed on a substrate according to another aspect of the invention.

FIG. 9 shows a transistor 120 including source/drain regions 128 formed within a substrate 122. A gate dielectric 124 is formed over substrate 122 and a gate metal layer 126 is formed over gate dielectric 124. Metal layer 126 is located within a word line trench formed in substrate 122. A gate fill layer 130 fills the entire trench over metal layer 124. A transistor channel extends between source/drain regions 128 through substrate 122. Transistor 120 with metal layer 126 represents one example of a 3-D structure have a channel operationally associated with opposing sides of a gate. One advantage of forming a gate electrode in a word line trench is that it provides a longer gate length for a given feature area. A typical planar gate within the same feature area may have a much shorter gate length.

According to another aspect of the invention, a transistor gate forming method includes forming a gate metal layer containing titanium nitride within a gate line opening extending into a semiconductive substrate and filling all of the opening over the metal layer with a gate fill layer containing polysilicon. A thickness of the fill layer within the opening is greater than a thickness of the metal layer. The fill layer is substantially selectively etchable with respect to the metal layer and the metal layer is substantially selectively etchable with respect to the fill layer. The fill layer exhibits a porosity greater than a porosity of the metal layer. The metal layer/fill layer combination exhibits less intrinsic stress than would otherwise exist if the fill layer were replaced by an increased thickness of the metal layer.

According to a further aspect of the invention, a transistor gate forming method includes forming a gate line opening extending into a semiconductive substrate, the opening having a semiconductive bottom and semiconductive side walls. A gate dielectric is formed within the opening over the semiconductive side walls and semiconductive bottom, the dielectric layer having an insulative bottom and insulative side walls. A gate metal layer is formed within the opening over the insulative bottom and insulative side walls, the metal layer having a conductive bottom and conductive side walls. A gate fill layer is formed within the opening over the conductive bottom and conductive side walls. The method includes removing excess fill layer substantially selectively with respect to the metal layer while exposing a portion of the metal layer under the fill layer without exposing the gate dielectric under the metal layer. As mentioned previously, an advantage exists in forming a fill layer followed by removing excess fill layer while exposing the metal layer without exposing the dielectric layer. Namely, removal processes directed toward the fill layer may damage the dielectric layer. Accordingly, substantially selective removal of excess fill layer leaves the metal layer to protect the underlying dielectric layer. Subsequent removal of the metal layer may occur substantially selectively with respect to the fill layer. Such a removal process may expose the underlying dielectric layer without damaging it.

According to a still further aspect of the invention, a transistor gate forming method includes forming a gate line opening extending into a semiconductive substrate, the opening having a semiconductive bottom and semiconductive, side walls. A gate dielectric layer is formed within the opening over the semiconductive side walls and semiconductive bottom, the dielectric layer having an insulative bottom and insulative side walls. A gate metal layer containing titanium nitride is formed within the opening over the insulative bottom and insulative side walls, the metal layer having a conductive bottom and conductive side walls. The method includes filling all of the opening over the conductive bottom and conductive side walls with a gate fill layer containing polysilicon, a thickness of the fill layer within the opening being greater than a thickness of the metal layer. Excess fill layer is removed selectively with respect to the metal layer at a selectivity ratio of at least 5 to 1 while exposing a portion of the metal layer under the fill layer within the opening, but without exposing the dielectric layer under the metal layer within the opening. The exposed portion of the metal layer is removed selectively with respect to the fill layer at a selectivity ratio of at least 5 to 1, the fill layer exhibiting a porosity greater than a porosity of the metal layer, and the metal layer/fill layer combination exhibiting less intrinsic stress than would otherwise exist if the fill layer were replaced by an increased thickness of the metal layer.

Given the variations in methods for forming a transistor gate discussed herein, a variety of transistor structures may result. According to one aspect of the invention, a transistor structure includes a gate line opening extending into a semiconductive substrate, the opening having a semiconductive bottom and semiconductive side walls. A gate dielectric layer is within the opening over the semiconductive side walls and semiconductive bottom, the dielectric layer having an insulative bottom and insulative side walls. A gate metal layer is within the opening over the insulative bottom and insulative side walls, the metal layer having a conductive bottom and conductive side walls. A gate fill layer is within the opening over the conductive bottom and conductive side walls. The metal layer/fill layer combination exhibits less intrinsic less than would otherwise exist if the fill layer were replaced by an increased thickness of the metal layer. One or more of the various properties and structural features of transistor structures discussed herein may be applied in the present aspect of the invention. By way of example, the fill layer may exhibit the property of being substantially selectively etchable with respect to the metal layer.

According to another aspect of the invention, a transistor structure includes a gate line opening extending into a semiconductive substrate, the opening having a semiconductive bottom and semiconductive side walls. A gate dielectric layer is within the opening over the semiconductive side walls and semiconductive bottom, the dielectric layer having an insulative bottom and insulative side walls. A gate metal layer containing titanium nitride is within the opening over the insulative bottom and insulative side walls, the metal layer having a conductive bottom and conductive side walls. A gate fill layer containing polysilicon fills all of the opening over the conductive bottom and conductive side walls. A thickness of the fill layer within the opening is greater than a thickness of the metal layer, the fill layer exhibits the property of being substantially selectively etchable with respect to the metal layer. The metal layer exhibits the property of being substantially selectively etchable with respect to the fill layer. The fill layer exhibits a porosity greater than a porosity of the metal layer. The metal layer/fill layer combination exhibits less intrinsic stress than would otherwise exist if the fill layer were replaced by an increased thickness of the metal layer.

Figure 10:
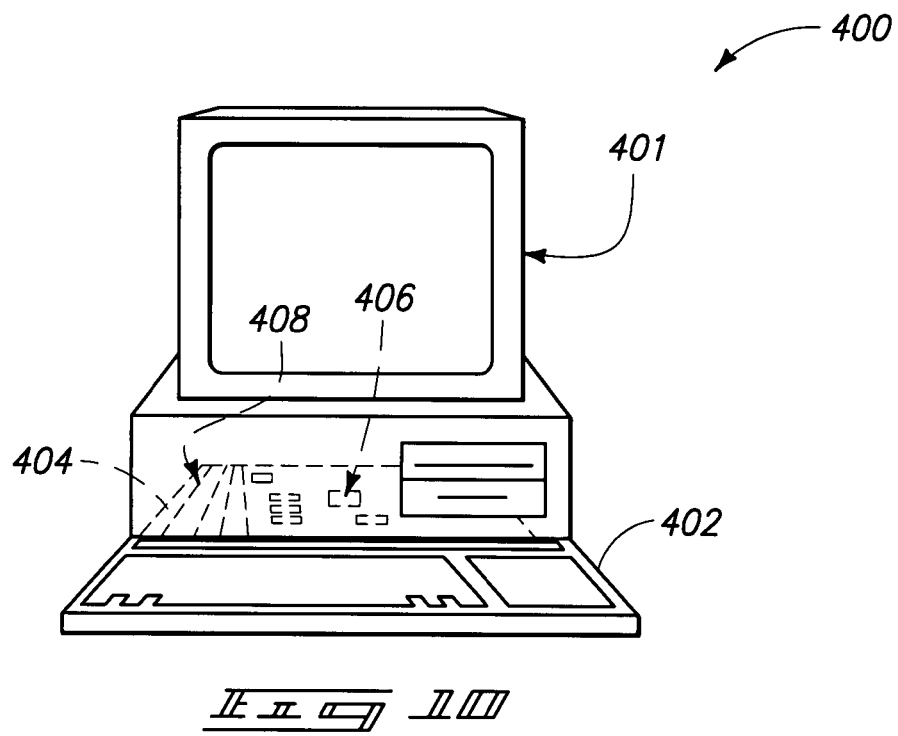
FIG. 10 is a diagrammatic view of a computer illustrating an exemplary application of the present invention.
Figure 11:
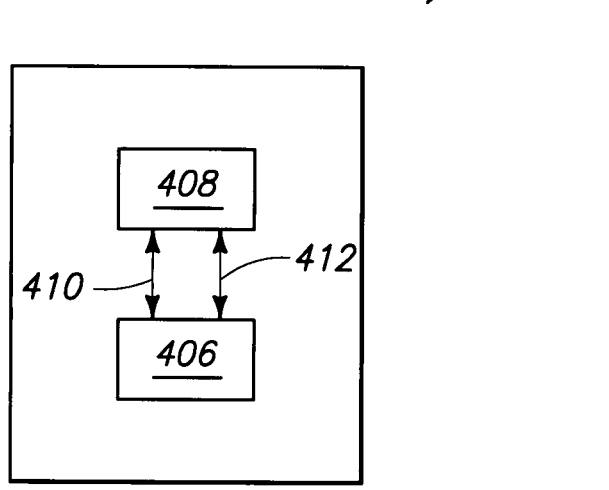
FIG. 11 is a block diagram showing particular features of the motherboard of the FIG. 10 computer.

FIG. 10 illustrates generally, by way of example, but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 11. In such block diagram, the addressing circuitry is illustrated as 410 and the read circuitry is illustrated as 412.

In particular aspects of the invention, memory device 408 can correspond to a memory module. For example, single in-line memory modules (SIMMs) and dual in-line memory modules (DIMMs) may be used in the implementation that utilizes the teachings of the present invention. The memory device can be incorporated into any of a variety of designs that provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory that allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

FIG. 12 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include DRAM cells in accordance with various aspects of the present invention.

FIG. 13 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first word line with pulses, circuitry 886 for providing the second word line with pulses, and circuitry 888 for providing the bit line with pulses. The system 800 also includes a processor 822, or memory controller for memory accessing.

The memory device 802 receives control signals 824 from the processor 822 over wiring or metallization lines. The memory device 802 is used to store data that is accessed via I/O lines. It will be appreciated by those skilled in the art that additional circuitry and control signals can be provided, and that the memory device 802 has been simplified to help focus on the invention. At least one of the processor 822 or memory device 802 can include a capacitor construction in a memory device of the type described previously herein.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of the ordinary skill in the art will understand that the various electronic systems can be fabricated in single-package processing units, or even on a single semiconductor chip, in order to reduce the communication time between the processor and the memory device(s). Applications for memory cells can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

EXAMPLE

A transistor structure as shown in FIGS. 5A-C was formed by supercritical fluid deposition of 150 Angstroms of TiN on the structure shown in FIGS. 1A-C. 500 to 2,000 Angstroms of polysilicon with a resistivity of 20 to 200 Ohm-centimeter were formed on the TiN by CVD. Chemical mechanical polishing followed, removing polysilicon and stopping on $Si_3N_4$ masking layer 12. Polysilicon was recessed into line openings 36 using 116 sec. of RIE in a LAM 9400 with 80 to 150 sccm of HBr and 100 to 200 sccm of He at a pressure of 50 to 100 milliTorr and a power of 125 to 225 Watts. Wet etching at 55° C. using 2 volume % $NH_4OH$ and 3 volume % $H_2O_2$ in deionized water for 7 min. produced the FIGS. 5A-C structure. Scanning electron microscopy of cross-sections and tilted top views did not reveal any cracks or stringers. The processing was repeated several times within the described parameter ranges, producing highly similar results. Subsequent $R_s$ testing revealed a range of 28.9 to 32.3 Ohm/square with a mean of 30.8 Ohm/square. Similar processing, except depositing polysilicon alone without the TiN revealed a range of 857 to 1838 Ohm/square with a mean of 1252 Ohm/square.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A transistor structure comprising:
    a gate line opening extending into a semiconductive substrate, the gate line opening having a semiconductive bottom and semiconductive side walls;
    a gate dielectric layer within the gate line opening over the semiconductive side walls and semiconductive bottom, the gate dielectric layer having an insulative bottom and insulative side walls;
    a gate metal layer within the gate line opening over the insulative bottom and insulative side walls, the gate metal layer having a conductive bottom and conductive side walls;
    a gate fill layer within the gate line opening over the conductive bottom and conductive side walls, the gate fill layer exhibiting a porosity greater than a porosity of the gate metal layer.

2. The structure of claim 1 wherein the gate line opening is a word line trench, the gate metal layer extending fully up the gate line opening side walls.

3. The structure of claim 1 wherein the gate line opening is a RAD opening laterally surrounding a source/drain pillar between opposing source/drain walls, the gate metal layer extending only partially up the gate line opening side walls.

4. The structure of claim 1 wherein the gate metal layer comprises titanium nitride.

5. The structure of claim 1 wherein the gate fill layer exhibits the property of being substantially selectively etchable with respect to the gate metal layer.

6. The structure of claim 1 wherein the gate fill layer is semiconductive or conductive.

7. The structure of claim 1 wherein a thickness of the gate fill layer within the gate line opening is greater than a thickness of the gate metal layer.

8. The structure of claim 1 wherein the gate fill layer fills all of the gate line opening over the gate metal layer.

9. The structure of claim 1 wherein the gate fill layer comprises polysilicon.

10. A transistor structure comprising:
a gate line opening extending into a semiconductive substrate, the gate line opening having a semiconductive bottom and semiconductive side walls;
a gate dielectric layer within the gate line opening over the semiconductive side walls and semiconductive bottom, the gate dielectric layer having an insulative bottom and insulative side walls;
a gate metal layer containing titanium nitride within the gate line opening over the insulative bottom and insulative side walls, the gate metal layer having a conductive bottom and conductive side walls;
a gate fill layer containing polysilicon filling all of the gate line opening over the conductive bottom and conductive side walls, a thickness of the gate fill layer within the gate line opening being greater than a thickness of the gate metal layer, the gate fill layer exhibiting the property of being substantially selectively etchable with respect to the gate metal layer, the gate metal layer exhibiting the property of being substantially selectively etchable with respect to the gate fill layer, and the gate fill layer exhibiting a porosity greater than a porosity of the gate metal layer.

11. The structure of claim 10 wherein the gate line opening is a word line trench, the gate metal layer extending fully up the gate line opening side walls.

12. The structure of claim 10 wherein the gate line opening is a RAD opening laterally surrounding a source/drain pillar between opposing source/drain walls, the gate metal layer extending only partially up the gate line opening side walls.

13. A transistor structure comprising:
a gate line opening extending into a semiconductive substrate;
a gate metal layer within the gate line opening;
a gate fill layer within the gate line opening over the gate metal layer, the gate fill layer exhibiting the property of being substantially selectively etchable with respect to the gate metal layer and exhibiting a porosity greater than a porosity of the gate metal layer.

14. The structure of claim 13 wherein the gate line opening is a word line trench.

15. The structure of claim 13 wherein the gate line opening is a RAD opening laterally surrounding a source/drain pillar between opposing source/drain walls.

16. The structure of claim 13 wherein the gate metal layer comprises titanium nitride.

17. The structure of claim 13 wherein the gate fill layer covers the gate metal layer at least within the gate line opening.

18. The structure of claim 13 wherein the gate fill layer fills all of the gate line opening over the gate metal layer.

19. The structure of claim 13 wherein the gate fill layer comprises polysilicon.

20. A transistor structure comprising:
a gate line opening extending into a semiconductive substrate;
a gate metal layer containing titanium nitride within the gate line opening;
a gate fill layer containing polysilicon filling all of the gate line opening over the gate metal layer, a thickness of the gate fill layer within the gate line opening being greater than a thickness of the gate metal layer, the gate fill layer exhibiting the property of being substantially selectively etchable with respect to the gate metal layer, the gate metal layer exhibiting the property of being substantially selectively etchable with respect to the gate fill layer, and the gate fill layer exhibiting a porosity greater than a porosity of the gate metal layer.

21. The structure of claim 20 wherein the gate line opening is a word line trench.

22. The structure of claim 20 wherein the gate line opening is a RAD opening laterally surrounding a source/drain pillar between opposing source/drain walls.

* * * * *

UNITED STATES PATENT AND TRADEMARK OFFICE
CERTIFICATE OF CORRECTION

PATENT NO. : 7,659,560 B2 Page 1 of 1
APPLICATION NO. : 11/716433
DATED : February 9, 2010
INVENTOR(S) : Sanh D. Tang et al.

It is certified that error appears in the above-identified patent and that said Letters Patent is hereby corrected as shown below:

On the Title page, Item (56), under "U.S. Patent Documents", in column 2, line 11, delete "6,625,373" and insert -- 6,525,373 --, therefor.

Signed and Sealed this

Eighteenth Day of May, 2010

David J. Kappos
*Director of the United States Patent and Trademark Office*